United States Patent
Chen et al.

(10) Patent No.: US 7,061,103 B2
(45) Date of Patent: Jun. 13, 2006

(54) CHIP PACKAGE STRUCTURE

(75) Inventors: Kai-Chi Chen, Nantou (TW);
Shu-Chen Huang, Keelung (TW);
Hsun-Tien Li, Hsinchu (TW);
Tzong-Ming Lee, Hsinchu (TW); Taro Fukui, Osaka (JP); Tomoaki Nemoto, Osaka (JP)

(73) Assignees: Industrial Technology Research Institute, Hsinchu (TW); Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/707,684

(22) Filed: Jan. 5, 2004

(65) Prior Publication Data

US 2004/0212970 A1 Oct. 28, 2004

(30) Foreign Application Priority Data

Apr. 22, 2003 (JP) ............................. 2003-117507
Oct. 24, 2003 (TW) .............................. 92129522 A

(51) Int. Cl.
*H01L 23/22* (2006.01)
*H01L 23/34* (2006.01)
(52) U.S. Cl. ........................ 257/713; 257/717; 257/777
(58) Field of Classification Search ........ 257/685–687, 257/712, 713, 717, 777, 778, 787, 796; 438/122, 438/126, 127
See application file for complete search history.

(56) References Cited

U.S. PATENT DOCUMENTS

| | | | | |
|---|---|---|---|---|
| 5,471,027 A * | 11/1995 | Call et al. | ................. | 219/85.13 |
| 6,610,560 B1 * | 8/2003 | Pu et al. | ...................... | 438/122 |
| 6,627,997 B1 * | 9/2003 | Eguchi et al. | ............... | 257/777 |
| 6,734,552 B1 * | 5/2004 | Combs et al. | ............... | 257/707 |
| 6,844,622 B1 * | 1/2005 | Huang et al. | ................ | 257/706 |
| 2003/0141582 A1 * | 7/2003 | Yang et al. | .................. | 257/686 |

* cited by examiner

*Primary Examiner*—T. N. Quach
(74) *Attorney, Agent, or Firm*—Jianq Chyun IP Office

(57) ABSTRACT

A chip package structure is disclosed. The chip package structure essentially comprises a carrier, one or more chips, a heat sink and an encapsulating material layer. At least one of the chips is flip-chip bonded and electrically connected to the carrier or another chip. There is a flip-chip bonding gap between the chip and the carrier or other chips. A heat sink is positioned on the uppermost chip. The encapsulating material layer fills the flip-chip bonding gap as well as a gap between the uppermost chip and the heat sink. A part of the surface of the heat sink away from the upper-most chip is exposed. Furthermore, the encapsulating material layer is formed in a simultaneous molding process. For example, the chip is separated from the heat sink by a distance between 0.03~0.2 mm, and the encapsulating material has a thermal conductivity greater than 1.2 W/m.K.

16 Claims, 5 Drawing Sheets

|  | Example 1 | Example 2 | Example 3 | Example 4 | Example 5 | Example 6 | Example 7 |
|---|---|---|---|---|---|---|---|
| Carrier Warpage *1 | 20μm | 20μm | 20μm | 20μm | 20μm | 20μm | 20μm |
| Solder persistence *2 | ▲ | ▲ | ▲ | ▲ | ▲ | ▲ | ▲ |
| Temperature recycle reliability *3 | 2000 cycles | 2000 cycles | 2000 cycles | 2000 cycles | 2000 cycles | 2000 cycles | 2000 cycles |
| PCT Reliability *4 | >500 hours | >500 hours | >500 hours | >500 hours | >500 hours | >500 hours | >500 hours |
| Heat dissipating capacity *5 | 5 minutes | 12 minutes | 20 minutes | 2 minutes | 20 minutes | 40 minutes | 35 minutes |

|  | Example 8 | Example 9 | Contrast example 1 | Contrast example 2 | Contrast example 3 |
|---|---|---|---|---|---|
| Carrier Warpage *1 | 20μm | 30μm | 80μm | 40μm | 50μm |
| Solder persistence *2 | ▲ | ▲ | X | O | ▲ |
| Temperature recycle reliability *3 | 2000 cycles | 2000 cycles | 300 cycles | 500 cycles | 2000 cycles |
| PCT Reliability *4 | >500 hours | >500 hours | 96 hours | 168 hours | >500 hours |
| Heat dissipating capacity *5 | >60 minutes | 40 minutes | 10 minutes | 30 seconds | 30 seconds |

*1 carrier warpage: height above a diagonal line of the carrier
*2 solder persistence: ▲ : JEDEC level II passed; O: JEDEC level III passed;
  (n = 11) X: JEDEC level III failed
*3 temperature recycle reliability: gaseous surrounding, 65°C/15min ~ 150°C/15min
  (n = 11)
*4 PCT reliability 121°C/2atms
*5 heat dissipating capacity: passing a 10 mA through aluminum wires on chip surface and measuring the interval before the wires are fused.

FIG. 9

CHIP PACKAGE STRUCTURE

CROSS REFERENCE TO RELATED APPLICATIONS

This application claims the priority benefit of Japan application serial no. 2003-117507, filed Apr. 22, 2003 and Taiwan application serial no. 92129522, filed Oct. 24, 2003.

BACKGROUND OF INVENTION

1. Field of the Invention

The present invention relates to a chip package structure. More particularly, the present invention relates to a chip package structure with superior heat dissipating capacity.

2. Description of the Related Art

In this fast and ever-changing society, information matters to all people. Many types of portable electronic devices are produced which attempts to catch up with our desires to transmit and receive more data. Nowadays, manufacturers have to factor into their chip package many design concepts such as digital architecture, network organization, local area connection and personalized electronic devices. To do so demands special consideration in every aspect of the design process that affects the processing speed, multi-functional capability, integration level, weight and cost of the chip package. In other words, chip packages must be miniaturized and densified. Flip chip (F/C) bonding technique, through the bonding of bumps to a carrier, is currently one of the principle means of reducing overall wiring length over the conventional wire-bonding method. With a shortening of wiring length in a F/C package, signal transmission rate between the chip and a carrier is increased. Thus, F/C packaging technique is one of the most popular methods of forming high-density packages. However, as density of each package continues to increase, heat dissipation becomes a major problem facing chip manufacturers.

FIG. 1A is a schematic cross-sectional view of a conventional chip package with a wire bonding structure. As shown in FIG. 1A, the chip packages has a chip 20 with an active surface 22 having a plurality of bonding pads (not shown) thereon. The back of the chip 20 is attached to a carrier 30 so that the active surface 22 faces upwards. The carrier 30 also has a plurality of contact pads (not shown) thereon. A plurality of conductive wires 24 is deployed to connect various the bonding pads with corresponding contact pads so that the chip 20 and the carrier 30 are electrically connected together. Furthermore, an array of solder balls 32 is attached to the carrier 30 on the far side of the chip 20. In other words, the chip package structure 10 has a ball grid array (BGA) packaging structure for connecting electrically with a printed circuit board (PCB). In addition, a encapsulating material layer 34 is formed over the carrier 30 to cover the chip 20 and the conductive wires 24. Since the encapsulating material layer 34 is fabricated with material having poor thermal conductivity, the chip package structure 10 has a low heat dissipating capacity.

FIG. 1B is a schematic cross-sectional view of a conventional chip package with a heat sink and a wire bonding structure. As shown in FIG. 1B, an additional heat sink 36 is incorporated into the chip package structure 12. However, because conductive wires 24 are positioned between the chip 20 and the heat sink 36, a minimum distance of separation of between 0.25~0.5 mm must be set aside for accommodating the conductive wires 24. With a greater package thickness, the rate of heat dissipating rate from the active surface 22 of the chip 20 to the heat sink 36 is rather low due to the poor thermal conductivity of the intervening encapsulating material. Therefore, the package can have serious heat dissipation problem when a high power chip is incorporated.

FIG. 2 is a schematic cross-sectional view of a chip package structure fabricated through a conventional flip-chip packaging technique. As shown in FIG. 2, the chip package structure 40 mainly comprises a chip 50, a carrier 80 and an encapsulating material layer 70. The chip 50 has an active surface 52 with a plurality of bonding pads (not shown) thereon. The carrier 80 also has a plurality of contact pads (not shown) thereon. A plurality of bumps 60 is positioned on the respective bonding pads on the active surface 52 of the chip 50. Furthermore, the bonding pads on the chip 50 and the contact pads on the carrier 80 are electrically connected together through the bumps 60. On the far side of the carrier 80 away from the chip 50, an array of solder balls 90 is attached.

To prevent any damage to the chip 50 due to an incursion of moisture and any damage to the bumps 60 due to mechanical stress, an encapsulating material layer 70 is formed within the bonding gap between the chip 50 and the carrier 80. Conventionally, the encapsulating material layer 70 is formed by channeling a liquid encapsulating material with low viscosity into the bonding gap between the chip 50 and the carrier 80 through capillary effect and then curing the injected material afterwards.

The flip-chip package structure 40 as shown in FIG. 2 has an electrical performance better than the conventional wire-bonded chip package structure 10 in FIG. 1A. Furthermore, the flip-chip package structure 40 has an ultrathin thickness suitable for embedding inside a slim device. However, it takes considerable time to fill up the bonding gap between the chip 50 and the carrier 80 with liquid encapsulating material through capillary effect alone. Hence, this method is unsuitable for economic mass production. Moreover, the number of bumps 60 inside the bonding gap, the distribution of the bumps 60 inside the package as well as the distance of separation between the flip chip 50 and the carrier 80 are some of the major factors affecting the capillary flow of liquid encapsulating material. Because the capillary effect is utilized to draw liquid encapsulating material into the space between the chip 50 and the carrier 80, any variation of the liquid flow conditions is likely to hinder the filling process leading to the possibility of formation of voids. In other words, reliability of the package will be affected.

In addition, the chip 50 within the chip package structure 40 is directly exposed. Hence, the chip 50 could be damaged when markings are imprinted on the surface of the chip 50 or the chip package structure 40 is picked up using a suction pad gripping the back of the chip 50. To avoid these defects, an alternative chip package structure is provided. FIGS. 3A and 3B are cross-sectional views of alternative chip package structures fabricated through another conventional flip-chip packaging technique. As shown in FIG. 3A, an additional over mold layer 72 is formed over the chip package structure 40 in FIG. 2 to protect the chip 50 against possible damage.

However, the need to form an additional over mold layer 72 increases overall processing time resulting in a drop in productivity. Moreover, delamination is a likely occurrence at the interface between the encapsulating material layer 70 and the over mold layer 72. In other words, overall reliability of the chip package structure 42 will drop.

To avoid delamination and increase productivity, an improved chip package structure 44 disclosed in Japanese pattern J392698 is shown in FIG. 3B. As shown in FIG. 3B, a simultaneous molding operation is carried out to form an encapsulating material layer 74 that covers the chip 50 and the carrier 80 and fills the bonding gap between the chip 50 and the carrier 80. Although the simultaneous molding process is able to prevent delamination, the encapsulating material layer 74 covering the chip still leads to poor heat dissipation from the chip package structure 44.

SUMMARY OF INVENTION

Accordingly, one objective of the present invention is to provide a chip package structure that combines the superior electrical performance of a flip-chip bonded device with the high heat dissipating capacity of a package with a heat sink.

To achieve these and other advantages and in accordance with the purpose of the invention, as embodied and broadly described herein, the invention provides a chip package structure. The chip package structure mainly comprises a carrier, a chip, a heat sink and an encapsulating material layer. The chip has an active surface with a plurality of bumps thereon. The active surface of the chip is flipped over and bonded to the carrier in a flip-chip bonding process so that the chip and the carrier are electrically connected. The heat sink is set over the chip. The encapsulating material layer fills a bonding gap between the chip and the carrier and a gap between the heat sink and the carrier. At least a portion of a surface of the heat sink on the far side of the chip is exposed. Furthermore, the encapsulating material layer is formed in a simultaneous molding process.

This invention also provides an alternative chip package structure. The chip package structure mainly comprises a carrier, a chipset, a heat sink and an encapsulating material layer. The chipset is set over and electrically connected with the carrier. The chipset comprises a plurality of chips. At least one of the chips is flip-chip bonded to the carrier or another chip so that a flip-chip bonding gap is created between the chip and the carrier or another chip. The heat sink is set over the chipset. The encapsulating material layer fills the flip-chip bonding gap as well as a gap between the chipset and the heat sink. At least a portion of a surface of the heat sink on the far side of the chip is exposed. Furthermore, the encapsulating material layer is formed in a simultaneous molding process.

In addition, the chipset of this embodiment comprises a first chip and a second chip. The first chip has a first active surface. The first chip is attached to the carrier such that the first active surface is away from the carrier. The second chip has a second active surface with a plurality of bumps thereon. The second chip is bonded and electrically connected to the first chip in a flip-chip bonding process. The bumps set a flip-chip bonding gap between the first and the second chip.

Furthermore, the chipset further comprises a plurality of conductive wires. Each conductive wire connects a bonding pad on the first chip electrically with a corresponding contact pad on the carrier.

Alternatively, the chipset of this embodiment comprises a first chip, a second chip and a third chip. The first chip has a first active surface with a plurality of first bumps thereon. The first chip is bonded and electrically connected to the carrier in a flip-chip bonding process. The second chip has a second active surface. The second chip is attached to the first chip such that the second active surface is away from the first chip. The third chip has a third active surface with a plurality of second bumps thereon. The third chip is bonded and electrically connected to the second chip in a flip-chip bonding process. The first bumps set a flip-chip bonding gap between the first chip and the carrier and the second bumps set a flip-chip bonding gap between the second chip and the third chip.

Furthermore, the chipset further comprises a plurality of conductive wires. Each conductive wire connects a bonding pad on the second chip electrically with a corresponding contact pad on the carrier.

In the aforementioned embodiments of the chip package structure, the chip is separated from the heat sink by a distance between 0.03~0.2 mm, for example. The encapsulating material layer has a thermal conductivity greater than 1.2 W/m.K. The encapsulating material is fabricated from resin and the heat sink is made from a metal, for example. The chip package structure may further comprise an array of solder balls and at least a passive component. The solder balls are attached to the surface of the carrier away from the chips. The passive components are set over and electrically connected to the carrier. The carrier is a packaging substrate or a lead frame, for example.

In brief, because a heat sink is set over the chip, the chip package structure has a fast heat-dissipating pathway. Hence, reliability of the chip package structure in computation is improved. Furthermore, thickness of the encapsulating material layer between the chip and the heat sink is optimized in the design so that thermal conductive capacity between the chip and the heat sink is increased considerably.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a list showing examples, contrast examples as well as various test results performed on the chip package structure fabricated according to the preferred embodiment of this invention.

DETAILED DESCRIPTION

Figure 1A:
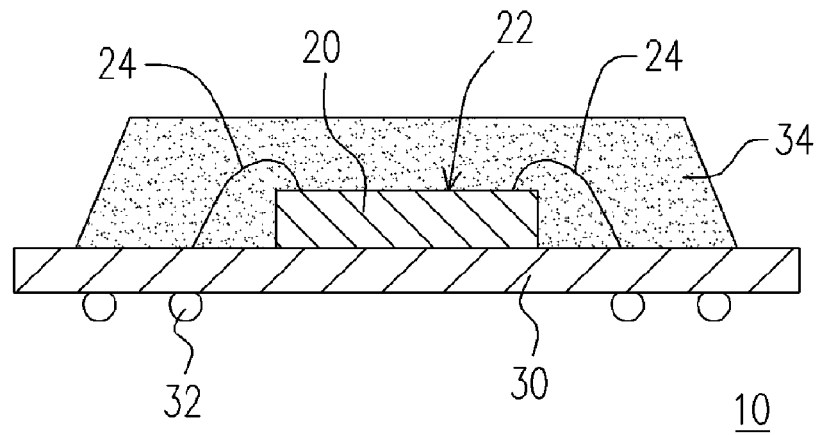
FIG. 1A is a schematic cross-sectional view of a conventional chip package with a wire bonding structure.
Figure 1B:
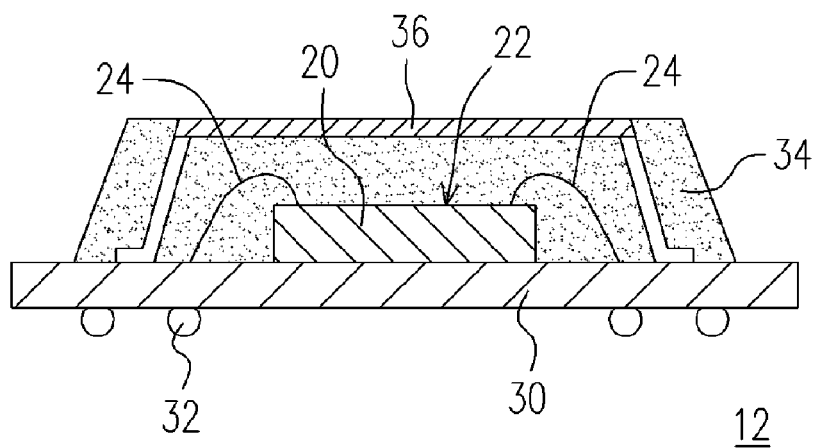
FIG. 1B is a schematic cross-sectional view of a conventional chip package with a heat sink and a wire bonding structure.

Reference will now be made in detail to the present preferred embodiments of the invention, examples of which are illustrated in the accompanying drawings. Wherever possible, the same reference numbers are used in the drawings and the description to refer to the same or like parts.

Figure 4:
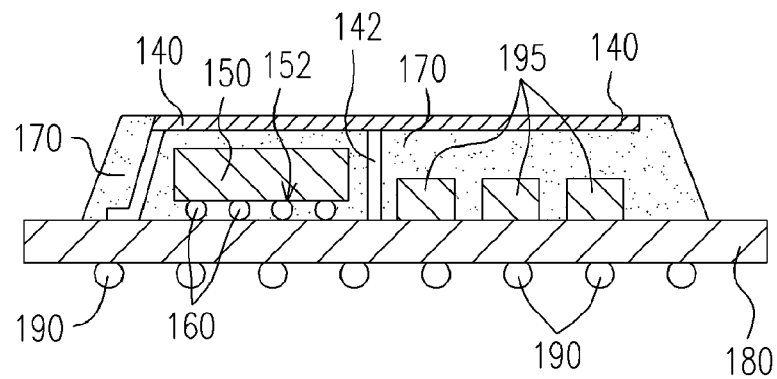
FIG. 4 is a schematic cross-sectional view of a chip package structure according to a first preferred embodiment of this invention.

FIG. 4 is a schematic cross-sectional view of a chip package structure according to a first preferred embodiment of this invention. As shown in FIG. 4, the chip package structure 100 mainly comprises a carrier 180, a chip 150, a heat sink 140 and an encapsulating material layer 170. The carrier 180 is, for example, an organic substrate, a ceramic substrate, a flexible substrate or a lead frame used in a flip-chip quad flat non-leaded (F/C QFN) packaging process. The carrier 180 has an upper and a lower surface with a plurality of contact pads (not shown) thereon.

The chip 150 has an active surface 152 with a plurality of bonding pads (not shown) thereon. A plurality of bumps 160 is attached to the bonding pads on the active surface 152 of the chip 150. The active surface 152 of the chip 150 is flipped over and bonded to the carrier 180 through the bumps 160 on the bonding pads so that the chip 150 and the carrier 180 are electrically connected. In other words, the chip package structure 100 of this embodiment includes at least a chip 150 bonded to the upper surface of a carrier 180 using a flip-chip bonding technique. However, aside from the chip 150, this invention also permits the mounting of other chips or passive components such as resistors or capacitors on the carrier 180 within the package structure 100.

The heat sink 140 is set over the chip 150. A plurality of heat-dissipating leads 142 extends from the edge of the heat sink 140. The heat-dissipating leads 142 extend from the edge of the heat sink 140 to the carrier 180 and serves as thermal conductive conduits for hastening the conduction of heat form the carrier 180 to the heat sink 140. Furthermore, the heat sink 140 has an area larger than the chip 150 so that a higher heat dissipating capacity is provided. However, the heat sink 140 is not limited to a single integrative unit. The heat sink 140 may comprise a multiple of individual heat sinks providing more flexibility to the design of the chip package structure.

The encapsulating material layer 170 fills a bonding gap between the chip 150 and the carrier 180 as well as a gap between the chip 150 and the heat sink 140. However, the surface of the heat sink 180 away from the chip 150 is exposed. Furthermore, the encapsulating material layer 170 is formed in a simultaneous molding process.

In this embodiment, the chip 150 is preferably separated from the heat sink 140 by a distance less than 0.3 mm. If the separation is larger than 0.3 mm, the heat-dissipating capacity after forming the encapsulating material layer 170 between the chip 150 and the heat sink 140 is poor. Ideally, the distance separating the chip 150 and the heat sink 140 should be between 0.03~0.2 mm. If the distance separating the chip 150 from the heat sink 140 is less than 0.03 mm, the encapsulating material might find it difficult to fill up the space. The encapsulating material layer 170 is fabricated using a resin, for example. To ensure a high heat-dissipating capacity, the encapsulating material layer 170 is preferably fabricated using a material having a thermal conductivity greater than 1.2 W/m.K.

The heat sink 140 is fabricated using a metallic material, for example. In this invention, the heat sink 140 has an area larger than the chip 150 so that the heat generated by the chip 150 is able to spread out into a large area. Therefore, metallic materials with high thermal conductivity including, for example, copper plate, aluminum plate, iron plate, nickel plate or other gold electroplated thereon is preferred. In addition, the heat sink 140 must withstand the pressure encountered during a molding process. Hence, the heat sink 140 is preferably fabricated using a high strength anti-warping material. Although there is a variety of high thermal conductive metallic material to choose from, the heat sink preferably has a thickness greater than 0.1 mm.

To ensure the formation of a strong adhesion between the encapsulating material layer 170 and the heat sink 140, the heat sink 140 may be required to undergo a chemical treatment, a roughening process or a gold plating operation prior to the molding process. Moreover, before forming the encapsulating material layer 170, the heat sink 140 must be stationed on the carrier 180 using an adhesive material or by bonding. The adhesive material must be strong enough to withstand the temperature and pressure conditions within the mold so that the heat sink 140 can remain in the desired location after the molding process. In general, the shape of the heat sink 140 and the adhesive area between the heat sink and the carrier 180 may be utilized in the design to attain the required stability. Furthermore, if a higher heat-dissipating capacity is required, a thermal conductive adhesive material may be used as an adhesive material to bonding the heat sink 140 and the carrier 180 together. However, the selection of a thermal conductive adhesive material is optional.

The chip package structure 100 may further comprise an array of solder balls 190 and at least a passive component 195. The solder balls 190 are attached to the contact pads on the lower surface of the carrier 180 ready for connecting with a printed circuit board, for example. The passive component 195 is set on the upper surface of the carrier 180 and also electrically connected with the carrier 180 as well.

Figure 3A:
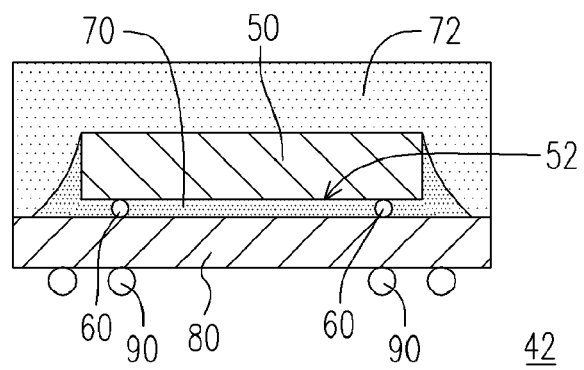
FIGS. 3A and 3B are cross-sectional views of alternative chip package structures fabricated through another conventional flip-chip packaging technique.

It is to be noted that the chip package structure 100 according to this invention differs from the conventional chip package structure in FIG. 3A in one major aspect, namely, the encapsulating material layer is formed in a simultaneous molding process. This prevents junction delamination resulting from performing multiple molding processes.

Figure 5:
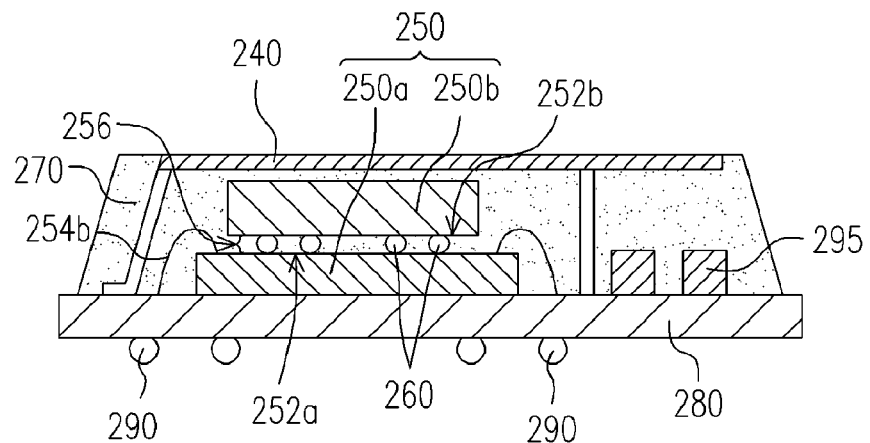
FIGS. 5 and 6 are schematic cross-sectional views of two chip packages structures according a second preferred embodiment of this invention.
Figure 6:
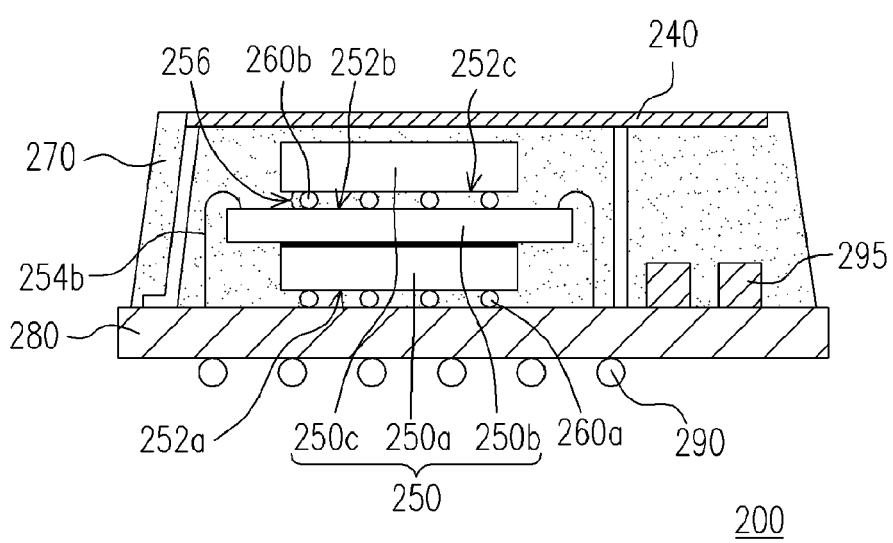

FIGS. 5 and 6 are schematic cross-sectional views of a chip package structure according to a second preferred embodiment of this invention. According to the second embodiment of this invention, a plurality of chips is embedded within the chip package structure. As shown in FIGS. 5 and 6, the chip package structure 200 mainly comprises a carrier 280, a chipset 250, a heat sink 240 and an encapsulating material layer 270. The chipset 250 comprises a plurality of chips and at least one of the chips is flip-chip bonded to the carrier 280 or another chip so that a flip-chip bonding gap 256 is created through the bumps. The heat sink 240 is set over the chipset 250. The encapsulating material layer 270 completely fills the flip-chip bonding gap 256 and the gap between the chipset 250 and the heat sink 240.

The chipset 250 is preferably separated from the heat sink 240 by a distance between 0.03~0.2 mm and the encapsulating material layer 270 preferably has a thermal conductivity preferably greater than 1.2 W/m.K.

As shown in FIG. 5, the chipset 250 comprises a first chip 250a and a second chip 250b. The first chip 250a has a first active surface 252a. The first chip 250a is attached to the carrier 280 such that the first active surface 252a is away from the carrier 280. The second chip 250b has a second active surface 252b with a plurality of bumps 260 thereon. The second chip 250b is bonded and electrically connected to the first chip 250a in a flip-chip bonding process. The bumps 260 set in the flip-chip bonding gap 256 between the first chip 250a and the second chip 250b.

Furthermore, the chipset 250 further comprises a plurality of conductive wires 254b. The carrier 280 has a plurality of contact pads (not shown) thereon. The first active surface 252a of the first chip 250a and the second active surface 252b of the second chip 250b have a plurality of bonding pads (not shown) thereon. The bumps 260 on the second chip 250b set the flip-chip bonding gap 256 between the first chip 250a and the second chip 250b. In other words, the second chip 250b is flip-chip bonded to the first active surface 252a of the first chip 250a. Each conductive wire 254b connects a bonding pad on the first chip 250a electrically with a corresponding contact pad on the carrier 280.

As shown in FIG. 6, an alternative chipset 250 of this embodiment comprises a first chip 250a, a second chip 250b and a third chip 250c. The chipset 250 further includes a plurality of conductive wires 254b. The first chip 250a has a first active surface 252a with a plurality of first bumps 260a thereon. The first chip 250a is bonded and electrically connected to the carrier 280 in a flip-chip bonding process. The second chip 250b has a second active surface 252b. The second chip 250a is attached to the first chip 250a such that the second active surface 252b of the second chip 250a is away from the first chip 250a. The conductive wires 254b connect the bonding pads on the second active surface 252b of the second chip 250b with corresponding contact pads on the carrier 280. The third chip 250c has a third active surface 252c with a plurality of second bumps 260b thereon. The third chip 250c is bonded and electrically connected to the second chip 250b in a flip-chip bonding process. The first bumps 260a set a flip-chip bonding gap between the first chip 250a and the carrier 280 and the second bumps set a flip-chip bonding gap between the second chip 250b and the third chip 250c. In other words, the third chip 250c is flip-chip bonded to the second active surface 252b of the second chip 250b and the first chip 250a is flip-chip bonded to the carrier 280.

In the second embodiment, the number of chips within the chip package structure is increased. In addition, not all the chips have to be bonded to the carrier using the flip-chip bonding technique. In fact, the main characteristic of this invention is that the chip package structure has at least a chip bonded to a carrier or another chip using the flip-chip bonding technique. Furthermore, a heat sink is mounted on the top of the chip and an encapsulating material layer is formed between the heat sink and the chip as well as inside the flip-chip bonding gap. Moreover, the encapsulating material layer is formed in a simultaneous molding process. Any chip package structure with the aforementioned characteristics should be considered as a design within the scope of this invention.

Figure 7A:
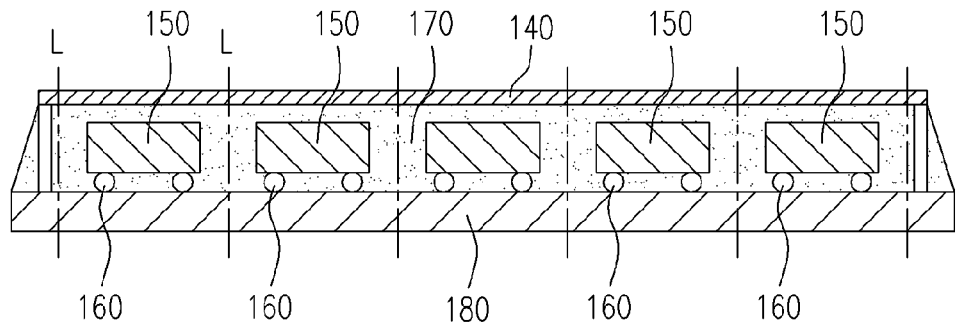
FIG. 7A is a schematic cross-sectional view of a finished product fabricated according to a chip package fabrication process according to this invention.
Figure 7B:
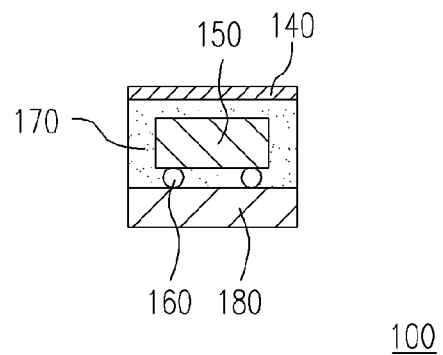
FIG. 7B is a schematic cross-sectional view of a singulated product fabricated according to a chip package fabrication process according to this invention.

FIG. 7A is a schematic cross-sectional view of a finished product fabricated according to a chip package fabrication process according to this invention. FIG. 7B is a schematic cross-sectional view of a singulated product fabricated according to a chip package fabrication process according to this invention. As shown in FIGS. 7A and 7B, the encapsulated semi-finished product is diced along a series of cutting lines L to form a plurality of chip package structures 100. Each singulated chip package structure 100 at least comprises a chip 150. Although the encapsulating material layer 170 in FIG. 7A is shown to be a coherent mass, the mold for forming the encapsulating material layer 170 can be adjusted to form a plurality of independent encapsulating material layers 170. In other words, encapsulating material is prevented from entering the cutting zones so that total time for cutting out all the chip package structures 100 is reduced.

It is to be noted that a reduced-pressure transfer molding process may be used to form the encapsulating material layer in the process of fabricating the chip package structure. In the reduced-pressure transfer molding process, the chips to be enclosed are placed inside a mold cavity. After reducing the pressure inside the mold cavity, encapsulant is channeled into the mold cavity. Thereafter, the mold is heated and pressurized so that the resin is cured. Ordinary transfer molding process has insufficient capacity for forming a fully filled encapsulating material layer in the flip-chip bonding gap or the gap between the chip and the heat sink. On the other hand, if the pressure inside the mold cavity is allowed to a level lower than a level below 20 mm-Hg, the filling capability of the encapsulating material will improve considerably. Preferably, the mold cavity is set to a pressure below 10 mm-Hg.

Figure 8:
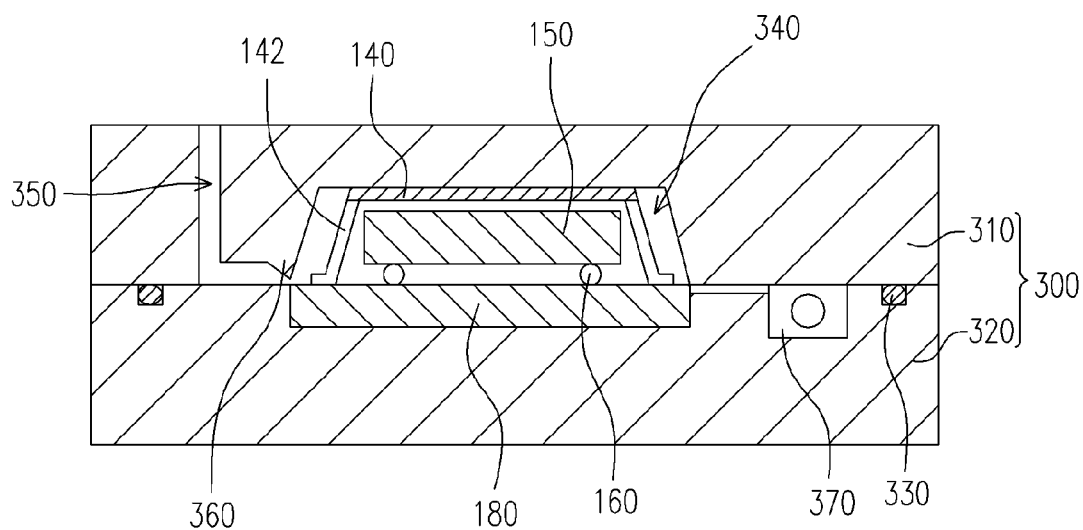
FIG. 8 is a schematic cross-sectional view showing a mold for forming the encapsulating material layer of a chip package structure in a reduced-pressure transfer molding process according to this invention.

FIG. 8 is a schematic cross-sectional view showing a mold for forming the encapsulating material layer of a chip package structure in a reduced-pressure transfer molding process according to this invention. As shown in FIG. 8, a mold 300 is placed inside a set of transfer molding equipment (not shown). The mold 300 comprises an upper mold section 310 and a lower mold section 320. To provide an effective vacuum when the upper mold 310 and the lower mold 320 are put together, the upper mold section 310, the lower mold section 320 and a vacuum rubber ring 330 inside the mold 300 are pressed to make a light contact. Air is drawn from a mold cavity 340 of the mold 300 using a vacuum pump (not shown) by way of a vacuum pipeline 370 so that the pressure inside the mold cavity 340 is reduced. Thereafter, plastic tablets (not shown) are deposited into a plastic injection pipeline 350 within the mold 300. Pumping is continued for another 1~5 seconds to increase the degree of vacuum inside the mold cavity 340. In the meantime, the mold 300 is heated so that the plastic tablets melt to form a fluidic encapsulating material. Finally, the upper mold section 310 and the lower mold section 320 are tightly sealed and a plunger 360 is lifted so that the melt encapsulating material is channeled into the mold cavity 340. This completes a reduced-pressure transfer molding process.

During the reduced-pressure molding process, the mold is controlled at a temperature at least 5° C. below the melting point of the bumps 160. If temperature of the mold is higher than this value, the pressure generated by the melting encapsulating material may peel from the chip 150 when the bonding strength between the bumps 160 and the chip 150 is not strong enough.

In addition, according to the chip packaging process of this invention, maximum diameter of particles constituting the encapsulating material is preferably smaller than 0.5 times the flip-chip bonding gap. If the encapsulating material contains particles with diameter greater than 0.5 times the flip-chip bonding gap, difficulties in filling the flip-chip gap or the gap between the chip and the heat sink may be encountered. Furthermore, friction caused by the movement of encapsulating material may damage the chip surface and lower its reliability. Aside from silicon dioxide in the melting state, thermal conductive fillers may be added to the encapsulating material to boost heat-dissipating capacity. Thermal conductive fillers having a high thermal conductivity includes, for example, crystalline silicon, aluminum oxide, silicon nitride, boron nitride and aluminum nitride. Because most high heat conductive encapsulating material generally is hard and easily scratches chip surfaces, maximum particle diameter of the added thermal conductive fillers is preferably below ⅓ times the flip-chip bonding gap.

Another molding process for forming the chip package structure according to the embodiment of this invention is a two-stage process. First, liquid encapsulating material is injected into a mold cavity at a reduced pressure and normal temperature. Thereafter, pressure inside the mold cavity is increased and heat is simultaneously applied to cure the encapsulating material. In this case, spot injection equipment can be used to form the encapsulating material layer. However, because a printing process has a higher output, a commercial "vacuum printing machine" may be used.

In the molding process, liquid encapsulating material is preferably channeled into the mold cavity at a pressure below 2 mm-Hg. If a pressure higher than 2 mm-Hg is used, incomplete filling by the encapsulating material may occur. To cure the encapsulating material, the pressure inside the mold cavity to a value between 2~5 kg/cm$^2$ accompanied by the application of heat whose amount is dependent upon the curing conditions. According to the chip package process of this invention, the encapsulating material is preferably heated to a temperature above 40° C. but below the curing temperature for 3 minutes before increasing the pressure for the subsequent curing process. In this way, the viscosity of the encapsulating material will remain low enough to fill all gaps inside the mold cavity.

The maximum particle diameter of filler within the encapsulating material during the liquid state is at most ⅓ times the flip-chip bonding gap and has a percentage weight smaller than 95%. If the particle diameter is greater than ⅓ times the flip-chip bonding gap and has a percentage weight greater than 95%, the filler material may block the flow of encapsulating material leading to an incomplete filling of the flip-chip bonding gap. Aside from silicon dioxide in the melting state, thermal conductive fillers added to the encapsulating material to boost heat-dissipating capacity may include, for example, crystalline silicon, aluminum oxide, silicon nitride, boron nitride and aluminum nitride.

Furthermore, to reduce residual stress within the chip package structure and prevent the carrier from warping, some plasticiser may be added to the encapsulating material in the liquid state. Preferably, the percentage weight of the plasticiser is over 90% and the maximum particle diameter of the plasticiser is at most ⅓ times the flip-chip bonding gap.

In the following, actual examples and contrast examples of this invention as well as their application results are described.

EXAMPLE 1

Each of the chips having a total area 8 mm×8 mm, 800 lead-tin bumps (melting point 183° C., pitch separation 0.25 mm) and a thickness 0.3 mm are set as an array over a FR-5 carrier with an area 35 mm×35 mm, a thickness 0.4 mm. To provide a uniform distribution of current, aluminum wires are set on the surface of the chip. The flip-chip bonding gap is between 50 to 75 μm. A 25 mm×25 mm heat sink with a thickness of about 0.2 mm is fabricated from a copper plate. The heat sink is attached to the carrier using a conventional thermal conductive adhesive material. To increase the bonding strength, the upper surface of the copper plate is nickel-coated and the lower surface of the copper plate is roughened. In processing the copper plate, the copper plate is also bent and shaped in such a way that a standoff height of 0.8 mm is created. A set of transfer molding equipment with reduce-pressure molding capability is used to performing the reduced-pressure molding process. The pressure inside the mold cavity is reduced to an almost vacuum state of 1 mm-Hg during the molding process. The encapsulating material is CV8710F2 (having a maximum particle diameter 20 μm, average particle diameter 5 μm, all silicon filler, thermal conductivity 0.9 W/m.K) produced by Matsushita Electric Works, Ltd. The encapsulating material layer has a thickness of about 0.8 mm and a total encapsulating area around 29 mm×29 mm. The molding process is carried out at 160° C. and a pressure of 70 kg/cm$^2$ for about 2 minutes. Thereafter, a post-curing process is carried out at a temperature of 175° C. for 4 hours to produce a chip package structure as shown in FIG. 4. The thickness of the gap between the chip and the heat sink in a section through the device is about 0.23 mm.

EXAMPLE 2

Aside from changing the standoff height and the package thickness in example 1 to 0.7 mm, other aspects are identical. A device as shown in FIG. 4 is produced.

EXAMPLE 3

Aside from changing the thickness of copper in example 2 to 0.27 mm, other aspects are identical. A device as shown in FIG. 4 is produced. The thickness of the gap between the chip and the heat sink in a section through the device is about 0.06 mm.

EXAMPLE 4

Aside from changing the thickness of the copper plate in example 1 to 0.15 mm and the standoff height and the package thickness to 0.9 mm, other aspects are identical. A device as shown in FIG. 4 is produced. The thickness of the gap between the chip and the heat sink in a section through the device is about 0.38 mm.

EXAMPLE 5

Aside from replacing the encapsulating material in example 1 with 50% silicon and 50% aluminum oxide (the maximum particle diameter of the filler material 7 μm, average particle diameter 1.5 μm), other aspects are identical. A device as shown in FIG. 4 is produced. The encapsulating material has a thermal conductivity 1.5 W/m.K.

EXAMPLE 6

Aside from replacing the encapsulating material in example 1 with 50% silicon and 50% boron nitride (the maximum particle diameter of the filler material 7 μm, average particle diameter 2 μm), other aspects are identical. A device as shown in FIG. 4 is produced. The encapsulating material has a thermal conductivity 1.9 W/m.K.

EXAMPLE 7

Aside from replacing the encapsulating material in example 2 to the one in example 5 having a thermal conductivity of 1.5 W/m.K, other aspects are identical. A device shown in FIG. 4 is produced.

EXAMPLE 8

Aside from replacing the encapsulating material in example 2 to the one in example 6 having a thermal conductivity of 1.9 W/m.K, other aspects are identical. A device shown in FIG. 4 is produced.

EXAMPLE 9

Aside from changing the heat sink in example 7 to an aluminum plate and performing a bending process, other aspects are identical. A device as shown in FIG. 4 is produced. The exposed portion is 22 mm, the same as in example 7. Similarly, the encapsulating material and the standoff are the same as in example 7, about 0.7 mm.

CONTRAST EXAMPLE 1

The same chip as in example 1 and conventional liquid underfill material (Matsushita Electric Works product CV5183F) is used. Spot injection equipment is deployed to carry out the flip-chip bonding gap filling process. After curing the filling material at prescribed conditions, a chip package structure as shown in FIG. 2 is produced.

CONTRAST EXAMPLE 2

Figure 2:
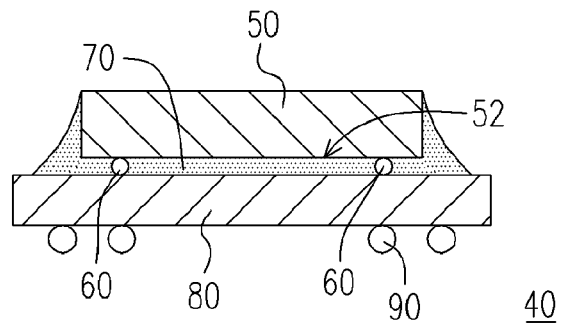
FIG. 2 is a schematic cross-sectional view of a chip package structure fabricated through a conventional flip-chip packaging technique.
Figure 3B:
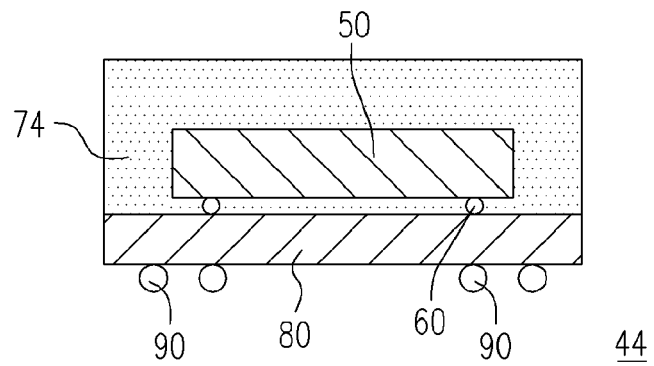

Based on contrast example 1, that is, the chip package structure in FIG. 2, the mold and encapsulating material identical to example 1 is used. A chip package structure as shown in FIG. 3 is produced.

CONTRAST EXAMPLE 3

Aside from not using any copper heat sink, all other aspects are identical to example 1. A chip package structure as shown in FIG. 4 is produced.

The aforementioned examples, contrast examples and the test results of various chip package structures are listed in FIG. 9.

The process of fabricating a chip package according to the preferred embodiment of this invention is based on a technique disclosed in a Japanese patent No. JP392698 (2001). This invention aims at optimizing the package dimension as well as incorporating a heat sink so that the chip package structure can have optimal reliability and heat-dissipating capacity.

In summary, this invention incorporates a heat sink into the chip package structure. Furthermore, the chip is encapsulated in a simultaneous molding process. Hence, the chip package structure has a lower degree of warping, a higher level of reliability and heat-dissipating capacity than a conventional chip package structure. If an encapsulating material with a high thermal conductivity is deployed, a much higher heat-dissipating capacity can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A chip package structure, comprising:
a carrier;
a chip, having an active surface with a plurality of bumps thereon, wherein the chip is flipped over and bonded to the carrier in a flip-chip bonding process so that the chip and the carrier are electrically connected;
a heat sink, set over the chip, wherein the chip is separated from the heat sink by a distance between 0.03~0.2 mm; and
an encapsulating material layer, filling a bonding gap between the chip and the carrier as well as a gap between the heat sink and the chip, wherein the encapsulating material layer is formed in a simultaneous molding process and part of the surface of the heat sink away from the chip is exposed, wherein the encapsulating material layer has a thermal conductivity greater than 1.2 W/m.K.

2. The chip package structure of claim 1, wherein material constituting the encapsulating material layer comprises a resin.

3. The chip package structure of claim 1, wherein material constituting the heat sink comprises a metal.

4. The chip package structure of claim 1, wherein the package further comprises an array of solder balls attached to a surface of the carrier away from the chip.

5. The chip package structure of claim 1, wherein the package further comprises at least a passive component set on and electrically connected with the carrier.

6. The chip package structure of claim 1, wherein the carrier is selected from a group consisting of a packaging substrate or a lead frame.

7. A chip package structure, comprising:
a carrier;
a chipset, set over and electrically connected to the carrier, wherein the chipset comprises a plurality of chips, at least one of the chips is bonded to the carrier or another chip in a flip-chip bonding process so that a flip-chip bonding gap is created;
a heat sink, set over the chipset, wherein the chipset is separated from the heat sink by a distance between 0.03~0.2 mm; and
an encapsulating material layer, filling the flip-chip bonding gap and a gap between the chipset and the heat sink, wherein the encapsulating material layer is formed in a simultaneous molding process and part of the surface of the heat sink away from the chipset is exposed, wherein the encapsulating material layer has a thermal conductivity greater than 1.2 W/m.K.

8. The chip package structure of claim 7, wherein the chipset at least comprises:
a first chip, having a first active surface, wherein the first chip is attached to the carrier such that the first active surface is positioned away from the carrier; and
a second chip, having a second active surface with a plurality of bumps thereon, wherein the second active surface of the second chip is bonded and electrically connected to the first chip in a flip-chip bonding process such that the bumps between the second chip and the first chip set a flip-chip bonding gap.

9. The chip package structure of claim 8, wherein the chipset further comprises a plurality of conductive wires with ends connected electrically to the first chip and the carrier respectively.

10. The chip package structure of claim 8, wherein the chipset at least comprises:
- a first chip, having an active surface with a plurality of first bumps thereon, wherein the first active surface of the first chip is bonded and electrically connected to the carrier in a flip-chip bonding process such that the first bumps between the first chip and the carrier set a flip-chip bonding gap;
- a second chip, having a second active surface, wherein the second chip is attached to the first chip such that the second active surface is positioned away from the first chip; and
- a third chip, having a third active surface with a plurality of second bumps thereon, wherein the third active surface of the third chip is bonded and electrically connected to the second chip in a flip-chip bonding process such that the second bumps between the third chip and the second chip set another flip-chip bonding gap.

11. The chip package structure of claim 10, wherein the chipset further comprises a plurality of conductive wires with ends electrically connected to the second chip and the carrier respectively.

12. The chip package structure of claim 7, wherein the material constituting the encapsulating material layer comprises a resin.

13. The chip package structure of claim 7, wherein the material constituting the heat sink comprises a metal.

14. The chip package structure of claim 7, wherein the package further comprises an array of solder balls attached to a surface of the carrier away from the chipset.

15. The chip package structure of claim 7, wherein the package further comprises at least a passive component set on and electrically connected with the carrier.

16. The chip package structure of claim 7, wherein the carrier is selected from a group consisting of a packaging substrate or a lead frame.

* * * * *